United States Patent [19]

Mayne et al.

[11] 4,438,867

[45] Mar. 27, 1984

[54] ELECTRICAL COMPONENT DISPENSING TOOL

[75] Inventors: David L. Mayne, Waterloo; David Jahsman, Sherrill, both of N.Y.

[73] Assignee: Industrial Design & Development Corp., Waterloo, N.Y.

[21] Appl. No.: 306,269

[22] Filed: Sep. 28, 1981

[51] Int. Cl.³ .............................................. B65D 85/42
[52] U.S. Cl. .................................. 221/197; 221/225; 221/236; 221/251; 221/274; 221/276
[58] Field of Search ............... 221/198, 163, 164, 165, 221/166, 167, 170, 251, 151, 274, 276, 208, 210, 232, 307, 309, 310, 197, 224, 225, 236, 267; 81/57.37; 227/130; 206/328, 499

[56] References Cited

U.S. PATENT DOCUMENTS

| 2,966,681 | 1/1961 | Campbell | 227/130 |
| 3,231,168 | 1/1966 | Ward | 227/130 |
| 3,245,596 | 4/1966 | Lygo | 227/129 |
| 4,327,832 | 5/1982 | de Matteo | 206/328 |

Primary Examiner—Joseph J. Rolla
Attorney, Agent, or Firm—Charles S. McGuire

[57] ABSTRACT

A manually-operable tool for holding a magazine containing a plurality of stacked, individual electrical components and selectively dispensing the components from the tool in predetermined orientation for loading on a printed circuit board, or the like. The magazine is inserted into an appropriately configured opening in the tool which is held by the operator with the magazine substantially vertical so that components are gravity fed to the lower end. Depression of a spring loaded rod by the operator's thumb moves a plunger to push a component out of engagement between a pair of gripper members. On the return stroke of the rod, a component transport member is moved thereby to carry the lowermost component fed by gravity from the magazine to engagement between the gripper members for ejection on the next depression of the rod and plunger.

24 Claims, 13 Drawing Figures

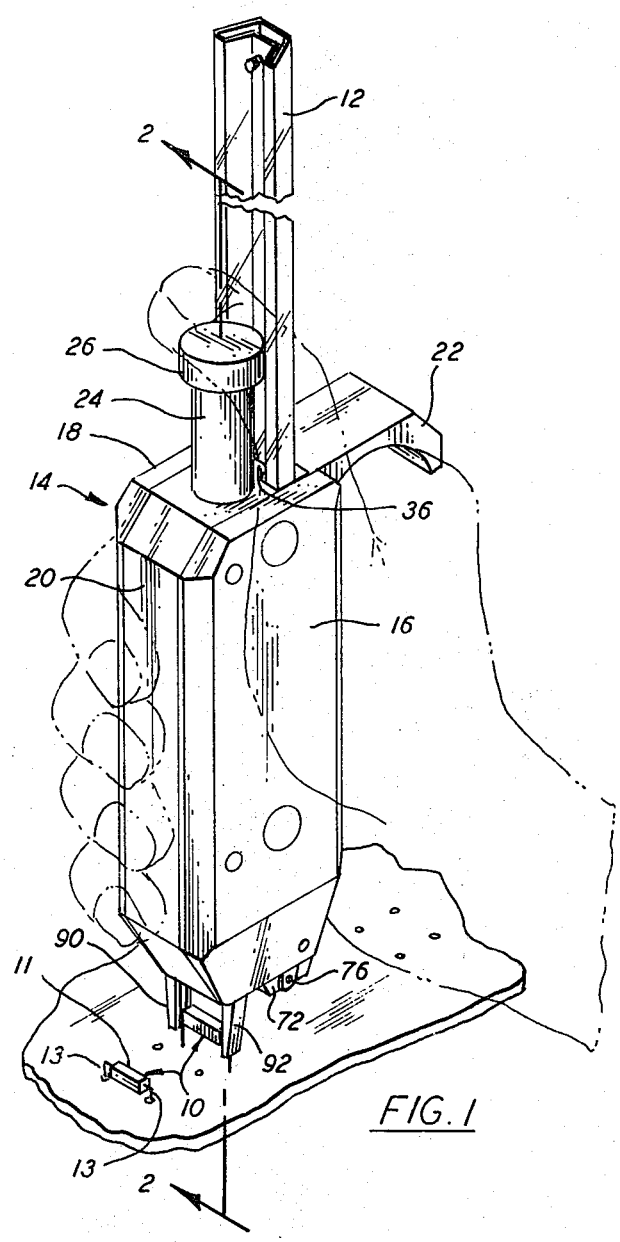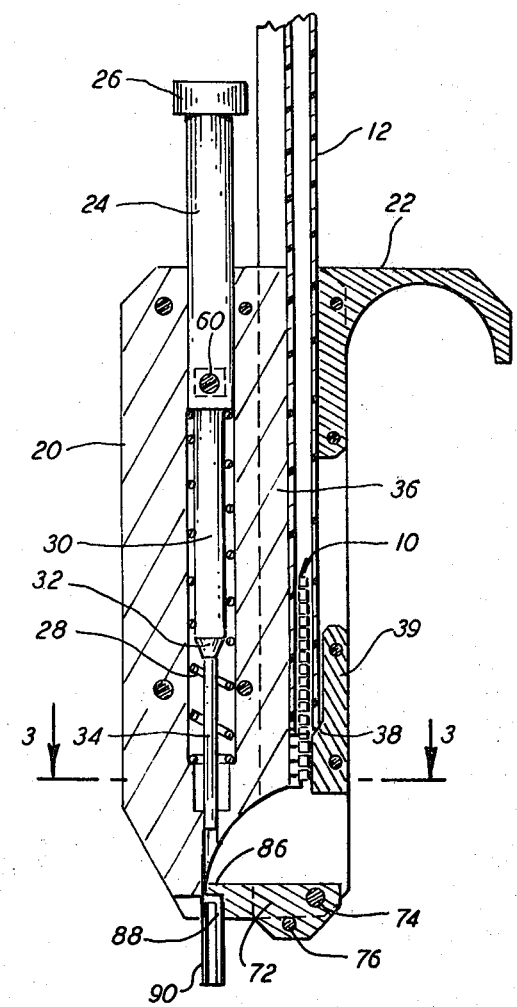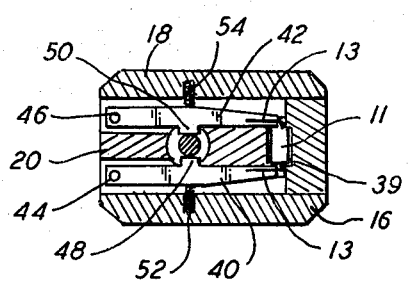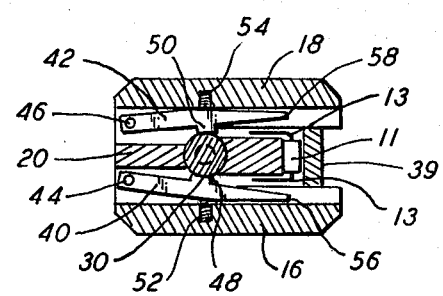

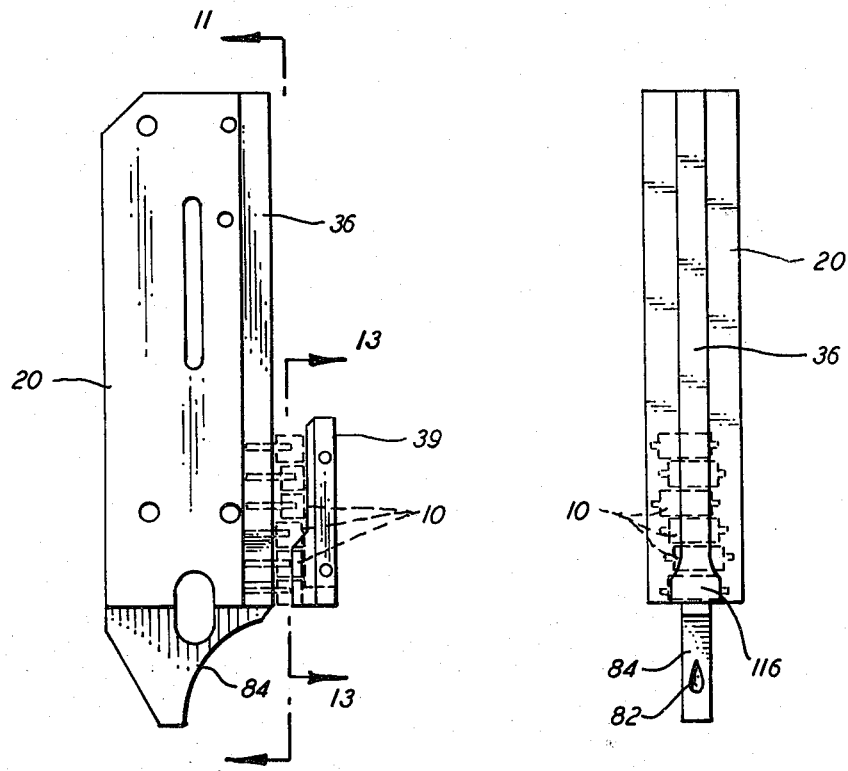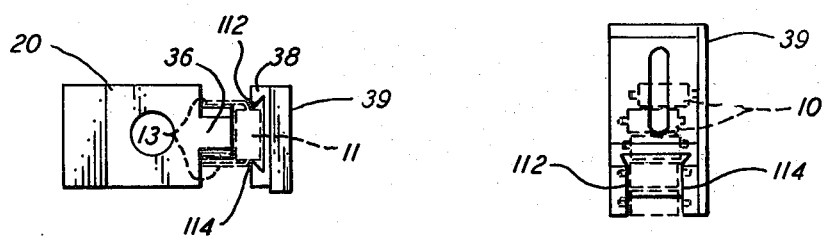

ELECTRICAL COMPONENT DISPENSING TOOL

BACKGROUND OF THE INVENTION

The present invention relates to hand-held tools for selectively ejecting a succession of individual electrical components in a predetermined orientation for loading on a circuit board, or similar applications. More specifically, the invention relates to a tool adapted to hold a magazine containing a plurality of individual electrical components and to feed the components sequentially from the magazine for ejection from the tool in a desired orientation.

For many years electrical components such as capacitors, resistors, transistors, diodes, integrated circuits, etc. have been provided in standardized configurations and dimensions for assembly with printed circuit boards, or in other applications. Each component is normally provided with two or more electrical leads which are inserted through appropriately spaced openings in the board and soldered to the conductor surrounding the opening on the opposite side of the board. Although the use of standardized, solid state devices on printed circuit boards reduced greatly the space and time required to produce an equivalent "hard wired" circuit, manual loading of individual, often very small, components on a printed circuit board can still be a time-consuming process.

It is a principal object of the present invention to provide a hand-held tool adapted to eject electrical components of specified shape and size in a desired orientation in response to selective manual actuation.

A further object is to provide a tool adapted to hold a magazine loaded with individual electrical components, and to eject the components from the tool in sequence as they are gravity fed from the lower end of the magazine.

Another object is to provide a manually operable tool which will hold a supply of stacked, individual, electrical components in a first orientation and feed the components sequentially through the tool for ejection therefrom in a second orientation.

A still further object is to provide a novel, manually operated tool for removing individual electrical components from a magazine and ejecting them in a predetermined orientation, said tool being relatively simple and inexpensive, yet reliable and durable in use.

In a more general sense, the object of the invention is to provide a manual tool which facilitates the assembly of electrical components with supporting structure, such as printed circuit boards.

Other objects will in part be obvious and will in part appear hereinafter.

SUMMARY OF THE INVENTION

In accordance with the foregoing objects, the invention contemplates a tool which comfortably fits an operator's hand and includes an upwardly facing opening configured to accept one end of a conventional magazine loaded with identical electrical components such as capacitors, resistors, etc. The end of the magazine which is inserted into the tool is open and, with the tool held in its normal operating position, is the lower end of the magazine so that components may be gravity fed therethrough. A pair of movable blocking members are mounted adjacent the open, lower end of the magazine to alternately block and unblock the passage of components for ejection from the tool in response to manual actuation.

An axially movable rod extends through the top of the tool body adjacent and parallel to the magazine. As the rod is depressed against a spring bias by the operator's thumb, a cam and lever mechanism rotates a pawl to a position below the lower end of the magazine (which is blocked by the blocking members) during an initial portion of the downward travel of the rod. In a terminal portion of the downward travel, mechanism associated with the rod moves the blocking members to allow the lowermost component to drop onto a component-transporting portion of the pawl positioned thereunder.

In an initial portion of the upward travel of the rod, under spring pressure, the blocking members move back to their initial, blocking position to prevent additional components from falling out of the magazine. In a terminal portion of the upward travel, the cam and lever again rotate the pawl to carry the component resting thereon to the tool ejection opening. A pair of gripper members are positioned adjacent this opening, and the component is engaged between these members at the termination of travel of the pawl. Upon the next downward travel of the rod, an ejector portion (which may be an integral extension of the rod) pushes the component which is held between the gripper members free of the tool, as the pawl picks up another component from the magazine.

The construction and operation of the tool, as summarized above, will be more clearly understood with reference to the accompanying drawings and following detailed description.

BRIEF DESCRIPTION OF THE DRAWINGS

FIG. 1 is a perspective view of the tool of the invention, with fragments of a conventional magazine and circuit board;

FIG. 2 is a side elevational view of the tool in section on the line 2—2 of FIG. 1;

FIG. 3 is a plan view in section on the line 3—3 of FIG. 2;

FIG. 4 is a plan view in section on the line 4—4 of FIG. 6;

FIG. 10 is a side elevational view of two cooperating elements of the tool;

FIG. 11 is a rear elevational view of one of the elements of FIG. 10 as seen on the line 11—11 thereof;

FIG. 12 is a top plan view of the elements of FIG. 10; and

FIG. 13 is a front elevational view of the other of the elements of FIG. 10 as seen on the line 13—13 thereof.

DETAILED DESCRIPTION

Figure 5:
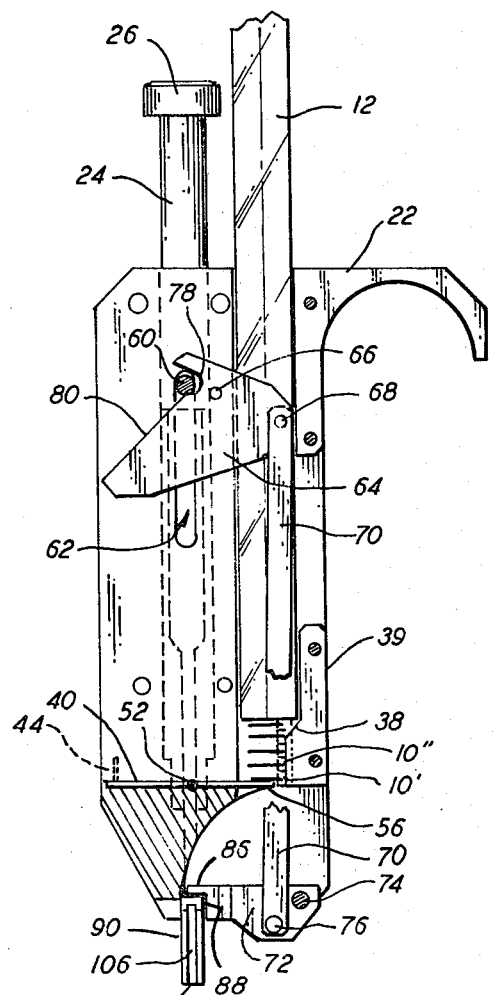
FIGS. 5 and 6 are side elevational views of the tool with the side cover plate removed showing certain movable elements at the two extreme limits of movement.

The tool of the invention is constructed to conform to the standard configuration and dimensions of the particular electrical components which are to be dispensed and the magazine in which they are contained. In the illustrated embodiment, electrical components 10 are assumed to be capacitors having a rectangular body 11 with a connector or lead 13 extending from each side. A plurality of components 10 is stacked within a hollow, elongated magazine 12 of generally U-shaped cross section, commonly termed a "slide pack." Each of components 10 is, of course, identical within prescribed tolerances, and both components 10 and magazine 12 are entirely conventional and form no part of the present invention.

The tool is denoted generally by reference number 14 and is intended to be grasped by an operator in one hand, as indicated in phantom lines in FIG. 1. Tool 14 includes a body portion formed of side plates 16 and 18, attached to central block 20. Handle 22 is affixed between side plates 16 and 18 at the upper rear of tool 14, being curved to rest upon the operator's index finger as illustrated in FIG. 1. Rod 24 has an upper end 26 positioned for engagement by the operator's thumb and extends through a bore in block 20 for reciprocal, axial movement therein. As best seen in Figure 2, spring 28 bears against stepped shoulders at reduced diameter portions of the rod and bore, thus exerting an upward bias on the rod. Reduced diameter portion 30 of rod 24 is joined by tapered portion 32 to a further reduced diameter portion, termed a plunger member, and denoted by reference number 34, which extends into a lower portion of the bore of similar diameter.

Block 20 is formed on its rear surface with central shoulder or rib 36 which, in cooperation with side plates 16 and 18, and handle 22, forms a generally U-shaped opening at the upper end of tool 14, and a U-shaped channel within the tool dimensioned for sliding insertion of magazine 12. Stop surface 38 is provided on back plate 39, affixed between the edges of side plates 16 and 18 to limit the extent of insertion of magazine 12 into the channel. The end of the magazine which is inserted into the channel is open; thus, it is necessary to hold the tool in a position such that components 10 do not fall out the open end during insertion.

When magazine 12 has been fully inserted against stop surface 38, tool 14 may be placed in the upright position shown in the drawings with the magazine substantially vertical and parallel to rod 24. Components 10 are prevented from falling out of the lower end of the channel by blocking means positioned adjacent the lower end thereof. In the illustrated embodiment, three or four of the components will fall from the lower end of the magazine when the tool is placed upright, but these remain in stacked relation and are guided to a rather precisely controlled position of the lowermost component which rests upon the blocking means by structure described later herein.

The blocking means, and their operation to unblock the lower end of the magazine in response to operator actuation, are best seen in the sectional views of FIGS. 3 and 4. A pair of members 40 and 42 are mounted for limited pivotal movement about pins 44 and 46, respectively, which extend upwardly into block 20. Members 40 and 42 include inwardly extending tabs 48 and 50 which are biased into engagement with plunger member 34 by springs 52 and 54. As rod 24 is depressed by the operator, tapered portion 32 is moved between tabs 48 and 50, rotating members 40 and 42 outwardly to the position of FIG. 4. In so doing, end portions 56 and 58 of member 40 and 42 are moved from blocking to unblocking positions under each of the leads 13 of the lowermost of components 10.

Figure 6:
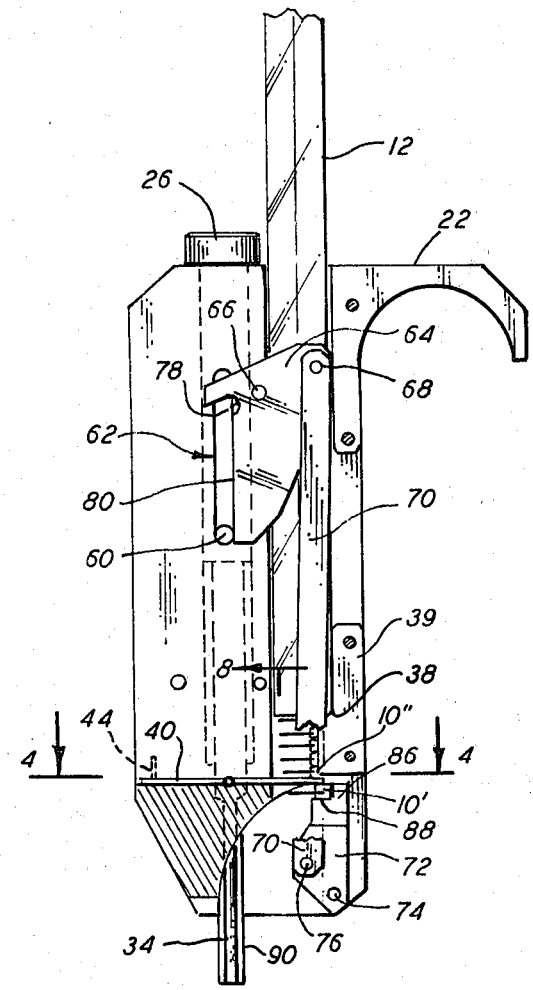

Referring now to FIGS. 5 and 6, pin 60 extends laterally from rod 24 through vertically elongated slot 62 in block 20. Cam element 64 is mounted for rotation about pin 66 and is pivotally connected by pin 68 to the upper end of lever 70. At the lower end of tool 14 pawl 72 is mounted for rotation about pin 74, which extends between the lower rear portions of side plates 16 and 18, and is pivotally connected to the lower end of lever 70 by pin 76. Cam 64 includes notch 78 and linear surface 80 which are engaged by pin 60 during travel of rod 24.

As rod 24 is depressed by the operator, cam 64 is rotated in a counter-clockwise direction, as shown in FIGS. 5 and 6 until pin 60 clears notch 78 and begins traveling down surface 80. Due to the configuration and pivoted mounting of cam 64, the rotation of the cam is completed during an initial portion of the travel of rod 24. As cam 64 rotates, lever 70 is moved upwardly, rotating pawl 72 in a clockwise direction from the position of FIG. 5 to that of FIG. 6.

As downward travel of rod 24 continues, the end of plunger member 34 exits the bore within block 20 through opening 82 (FIG. 8) in curved surface 84 of block 20. Again, due to the configuration and mounting of the movable elements, the end of plunger member 34 does not extend outside the bore until pawl 72 has cleared opening 82, thus avoiding interference between the plunger and pawl. During the terminal portion of travel of rod 24, tapered portion 32 moves between tabs 48 and 50 of member 40 and 42, as previously described, to move end portions 56 and 58 to the unblocking position. This allows the lowermost of the components indicated in FIG. 6 by reference numeral 10 to drop onto stepped shoulder 88 of pawl 72. This occurs in a terminal portion of travel of rod 24 as pin 60 reaches the lower end of slot 62.

As the operator releases thumb pressured on end 26 of rod 24 the force of spring 28, which has been compressed during downward travel of the rod, moves the rod upwardly from the position of FIG. 6 back to the position of FIG. 5. The movable elements, of course, travel in the directions opposite to those just described. In the initial portion of upward travel tapered portion 32 passes between tabs 48 and 50, and springs 52 and 54 move end portions 56 and 58 of members 40 and 42 back in to blocking position below leads 13 of the component indicated in FIG. 6 by reference numeral 10', i.e. the component immediately above component 10, as the blocking members return from the position of FIG. 4 to that of FIG. 3.

It should be pointed out that this operation of the blocking members is achieved through structural cooperation of both tool 14 and components 10. That is, with components 10 stacked upon one another and magazine 12 held in a vertical position, the height of each body portion 11 of the components is greater than that of leads 13, whereby a space is provided between the leads of adjacent components, the body portions of which are stacked directly upon one another. Thus, when a component drops from the bottom of the stack onto shoulder 88 of pawl 72, end portions 56 and 58 of blocking members 40 and 42 may be moved into the space between each of leads 13 on the component just dropped and the leads of the component resting thereon. This latter component will be prevented from dropping out of the lower end of the channel until members 40 and 42 are again moved to the unblocking position, when pawl 72 will again be positioned below the lower end of the channel to receive the next component.

Figure 7:
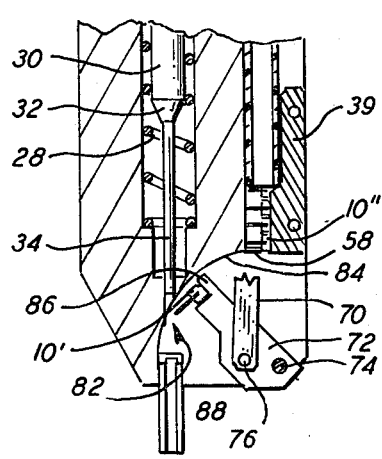
FIG. 7 is a fragmentary, side elevational view showing certain elements of FIGS. 5 and 6 in an intermediate position.

Rod 24 and integral plunger member 34 travel upwardly with pin 60 riding on linear surface 80 of cam 64 until the pin reaches notch 78. In the terminal portion of upward travel, cam 64 is rotated in a clockwise direction, lever 70 is moved downwardly, and pawl 72 is rotated counter-clockwise from the position of FIG. 6, through FIG. 7, and back to FIG. 5. As pawl 72 moves, it transports the component on shoulder 88 along curved surface 84, passing opening 82 after the end of plunger member 34 has moved into the bore, as previously mentioned and as shown in FIG. 7.

A pair of gripper members 90 and 92 are mounted on side plates 16 and 18, respectively, for pivotal movement about pins 94 and 96. Gripper members 90 and 92 extend downwardly from an ejection opening at the lower end of tool 14 formed by side plates 16 and 18 and block 20. In that illustrated embodiment, springs 98 and 100 bias terminal ends 102 and 104 of gripper members 90 and 92, respectively toward one another. However, since leads 13 have a certain degree of natural resiliency, a fixed space between members 90 and 92 slightly less than the nominal width of components 10 will provide frictional gripping of the components. The space may be adjustable, e.g., by means of set screws limiting the amount of pivotal movement of gripper members 90 and 92. Inwardly facing guide tracks 106 and 108 on gripper members 90 and 92 have a width somewhat greater than the widest part of leads 3 which extend laterally beyond body portion 11 of the components whereby as components 10 are carried by pawl 72 to the opening at the lower end of tool 14, leads 13 are inserted in guide tracks 106 and 108.

Figure 8:
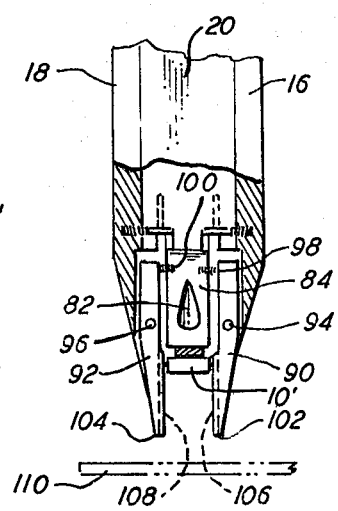
FIGS. 8 and 9 are fragmentary, rear elevational views, partly in section, on the line 8—8 of FIG. 6, showing certain elements in two positions of movement.
Figure 9:
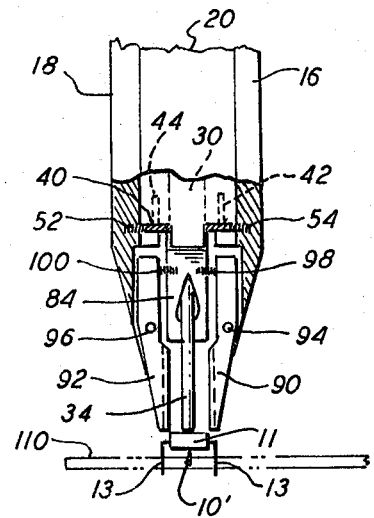

The spacing between members 90 and 92 is such that components 10 are gripped firmly thereby upon being transported by pawl 74 to the exit opening of tool 14, as component 10' is shown in FIG. 5. In the next depression or rod 24, plunger member 34 will engage component 10' and push it downwardly, guided by leads 13 riding in tracks 106 and 108. The resilient biasing of member 90 and 92, while allowing free travel of the component, insures that it is held firmly until it is pushed free of the gripper members, as shown in FIG. 9. Before pushing each component free, the leads thereof may easily be aligned with and started into the openings in a printed circuit board, or other support structure, such as indicated in FIGS. 8 and 9 by reference numeral 110.

FIGS. 10–13 illustrate the elements which cooperate to guide components 10 from the open end of magazine 12 to the desired position for gravity feed to shoulder 88 of pawl 72. As mentioned earlier, inclined surface 38 on back plate 39 provides a stop, limiting the extent of insertion of magazine 12 into the tool. Due to the wall thickness of magazine 12 and clearances normally provided between the components and the internal walls of the magazine, the required accurate positioning of the components to insure proper sequential feed is difficult to achieve. Possible shifts in lateral position of the components are shown, somewhat exaggerated, in FIGS. 11 and 13. This problem is addressed in the disclosed embodiment by a plurality of fixed guide surfaces on elements 20 and 39.

As components 10 exit the lower end of magazine 12 they are moved forwardly into engagement with the rear surface of rib 36 as they slide down forwardly inclined surface 38 of back plate 39, thereby establishing the fore and aft position of the components resting upon blocking members 40 and 42. A groove is formed in the forward surface of back plate 39 below surface 38, and the sides of the groove are flared outwardly toward the rear at about 30° angles to provide spaced edges 112 and 114. The nominal width of body portion 11 of the components is, e.g., 0.050" less than the spacing of edges 112 and 114, whereby the lateral position of the components is established and lateral movement or dragging is prevented as the components are gravity fed for pickup by pawl 72. Edges 112 and 114 extend below the level of blocking member 40 and 42 to insure lateral positioning is also aided by providing a radius on each side of rib 36 to form lower portion 116 having a width only slightly less than the nominal spacing of leads 13.

It will be noted that, once a component is positioned in the guide tracks, a full cycle is completed with each reciprocal move of rod 24. That is, each time the rod is depressed a component will be ejected as another component is transported to and positioned between the gripper members on the upward stroke of the rod. Each component is ejected in the same orientation with respect ot the tool, completely under manual control of the operator. Thus, it may be seen that the objects and advantages of the invention are efficiently attained through the apparatus of the foregoing detailed description.

What is claimed is:

1. A manually operated tool for sequentially ejecting, in predetermined orientation, individual electrical components of predetermined dimensions which are gravity fed from a magazine holding a stacked plurality of such components, said tool comprising, in combination:
    (a) a body portion having a first opening for receiving an open end of the magazine, and a second opening for ejection of components from the tool;
    (b) means for positioning said magazine open end in a predetermined location with said body portion;
    (c) an actuating member having a portion manually engagable by an operator for movement of said actuating member between first and second positions with respect to said body portion;
    (d) movable means arranged adjacent said predetermined location for movement between a first position, effectively blocking exit of components from said magazine open end, and a second position, allowing exit of components from said magazine open end, in response to movement of said actuating member between its first and second positions, respectively;
    (e) a component transport member having an end portion movable between a first position adjacent said second opening and a second position immediately below said movable means to receive on said end portion a component fed by gravity from said magazine open end when said movable means is in its second position, in response to movement of said actuating member between its first and second positions, respectively; and
    (f) an ejector portion effective to engage a component at said second opening and eject it from said tool upon movement of said actuating member to its second position.

2. The invention according to claim 1 wherein said ejector portion comprises an integral extension of said actuating member.

3. The invention according to claim 1 wherein said actuating member comprises an elongated rod movable axially between its first and second positions.

4. The invention according to claim 3 wherein said movable means comprise at least one blocking member having a portion positioned directly below said magazine open end when movable in a plane transverse to the axis of said rod to the second position of said movable means, laterally of its first position.

5. The invention according to claim 4 wherein said movable means is spring biased to the first position thereof.

6. The invention according to claim 5 wherein said movable means comprise a pair of said blocking members and said rod includes a tapered portion which moves between and contacts said blocking members to force the latter outwardly from the first to the second position of said movable means against said spring bias as said actuating member is moved from its first to its second position.

7. The invention according to claim 1 and further including linkage means connecting said actuating member and said component transport member for movement of the latter between its first and second positions in response to movement of the former between its first and second positions, respectively.

8. The invention according to claim 7 wherein said linkage comprises means for producing differential movement of said actuating and component transport members, whereby said component transport member is moved from its first to its second position in response to initiation of movement of said actuating member away from its first position.

9. The invention according to claim 8 wherein said actuating member comprises an elongated rod mounted for reciprocating axial movement between its first and second positions, and said component transport member comprises a pawl mounted for reciprocating pivotal movement between its first and second positions.

10. The invention according to claim 9 wherein said means for producing differential movement comprises a pin extending laterally from said rod, a cam member pivotally mounted upon said body portion and movable by said pin, and a link connecting said cam member to said component transport member and transmitting movement of the former to the latter.

11. The invention according to claim 1 wherein said means for positioning said magazine open end comprises a fixed stop surface within said body portion limiting the extent of insertion of the magazine into said first opening.

12. The invention according to claim 11 wherein said predetermined location of said magazine open end is spaced from said movable means by a distance equal to at least twice the height of one of said components whereby, upon placing said magazine open end against said stop surface and holding said tool in an upright position with said magazine substantially vertical, a plurality of said stacked components are between said magazine open end and said movable means, the lowermost of said components having portions resting upon said movable means.

13. The invention according to claim 12 and further including a plurality of guide surfaces within said body portion for establishing within closely predetermined limits the position of said lowermost component.

14. The invention according to claim 1 and further including means adjacent said second opening adapted to releasably engage a component transported to said second opening by said component transport member.

15. The invention according to claim 14 wherein said means adjacent said second opening comprise a pair of pivotally mounted gripper members mounted on opposite sides of said second opening and extend downwardly therefrom.

16. The invention according to claim 15 wherein said gripper members are spring biased to a position wherein the ends thereof adjacent said second opening are spaced by a distance slightly less than the width of said components, whereby a component transported to said second opening will be held between said gripper members until pushed free by said ejector portion.

17. The invention according to claim 15 wherein said gripper members include inwardly facing guide tracks which constrain the path of movement of components as they are pushed free of said gripper members by said ejector portion.

18. A combination of magazine-held electrical components and a hand-held tool for sequentially ejecting such components in predetermined orientation, said combination comprising:
  (a) a hollow, elongated magazine of substantially U-shaped cross section;
  (b) a plurality of electrical components each having a central portion of predetermined dimensions with electrical leads extending in the same direction from the ends of said central portion;
  (c) said central portions of said plurality of components being stacked upon one another within said magazine with said electrical leads extending into the two legs of the U-shaped magazine;
  (d) said tool including:
    (i) a body portion having a first opening communicating with a U-shaped channel dimensioned to accept said magazine for endwise, sliding insertion into said channel and support said magazine in a substantially vertical position when said tool is held upright;
    (ii) a stop surface within said body portion limiting the extend of advance of said magazine into said channel and holding the open, lower end thereof in a predetermined location within said tool for gravity feed of said components through said lower end; and
    (iii) movable means including an actuating member movable between first and second positions in response to operator actuation and blocking means positioned directly below said predetermined location and having a portion movable in response to movement of said actuating member to block and unblock passage of said components out of said magazine lower end, thereby ejecting a single one of said components from a second opening in said tool in response to actuation by an operator holding said tool.

19. The invention according to claim 18 wherein said blocking means is positioned below said predetermined location by a distance equal to more than twice the height of said com- ponent central portions whereby, upon placing said magazine in a vertical position, several of said components fall from said magazine lower end and are stacked between said lower end and said blocking means.

20. The invention according to claim 19 and further including fixed surfaces within said tool for guiding said components between said magazine lower end and said blocking means.

21. The invention according to claim 18 wherein said actuating member and blocking means are spring biased to their first and blocking positions, respectively.

22. The invention according to claim 18 wherein said movable means further includes a component transport member having a portion movable in response to movement of said actuating member between a position directly below said blocking means for receiving thereon one of said components when said blocking means is moved to its unblocking position and a position directly below said actuating member for engagement thereby and ejection from said tool.

23. The invention according to claim 22 wherein said portion of said blocking means, when in said blocking position, includes a pair of elements upon which the two leads of the lowermost component rest.

24. The invention according to claim 23 wherein said components are dimensioned to provide a space between each of the two leads of components which are congruently stacked upon one another, whereby said pair of blocking member elements extend into the space between the leads of said one component resting upon said portion of said transport member and the leads of a component resting upon said one component when said blocking means is in its blocking position.

* * * * *